United States Patent [19]

Nunn

[11] Patent Number: 5,483,198

[45] Date of Patent: Jan. 9, 1996

[54] METHOD AND APPARATUS FOR CONTROLLING AMPLIFIER POWER

[75] Inventor: Christopher J. Nunn, Winchester, England

[73] Assignee: AT&T Wireless Communications Products, Ltd., Hampshire, England

[21] Appl. No.: 325,327

[22] Filed: Oct. 25, 1994

[30] Foreign Application Priority Data

Jul. 1, 1992 [GB] United Kingdom ............... 9213996

[51] Int. Cl.⁶ .................................................. H03G 3/30
[52] U.S. Cl. ........................... 330/279; 330/138; 330/280; 330/285
[58] Field of Search .................................. 330/127, 129, 330/138, 278, 279, 280, 285, 290; 455/116, 126, 127

[56] References Cited

U.S. PATENT DOCUMENTS 4,592,073  5/1986  Watanabe ............... 455/126 X
5,132,634  7/1992  Suarez ...................... 330/279 X

FOREIGN PATENT DOCUMENTS

434294A2  6/1991  European Pat. Off. .
472330A2  2/1992  European Pat. Off. .

Primary Examiner—James B. Mullins
Attorney, Agent, or Firm—Wenderoth, Lind & Ponack

[57] ABSTRACT

A method and apparatus for controlling an amplifier power output, in particular, a transmitter RF Amplifier includes a control circuit connected to the RF Amplifier. The control circuit derives a control signal from a shaper circuit and this control signal is applied, together with a feedback signal representative of the flow of dc current through one of the stages of the amplifier, to a comparator to generate an error signal. The error signal is applied to a common amplifier base bias line. Preferably, all of the stages of the error amplifier are in a saturated state so that the effect of the error signal on the bias line causes the amplification envelope of the transistors in the amplifier to follow the error signal, thus generating a pulsed output signal having an envelope shape corresponding to the control signal.

18 Claims, 1 Drawing Sheet

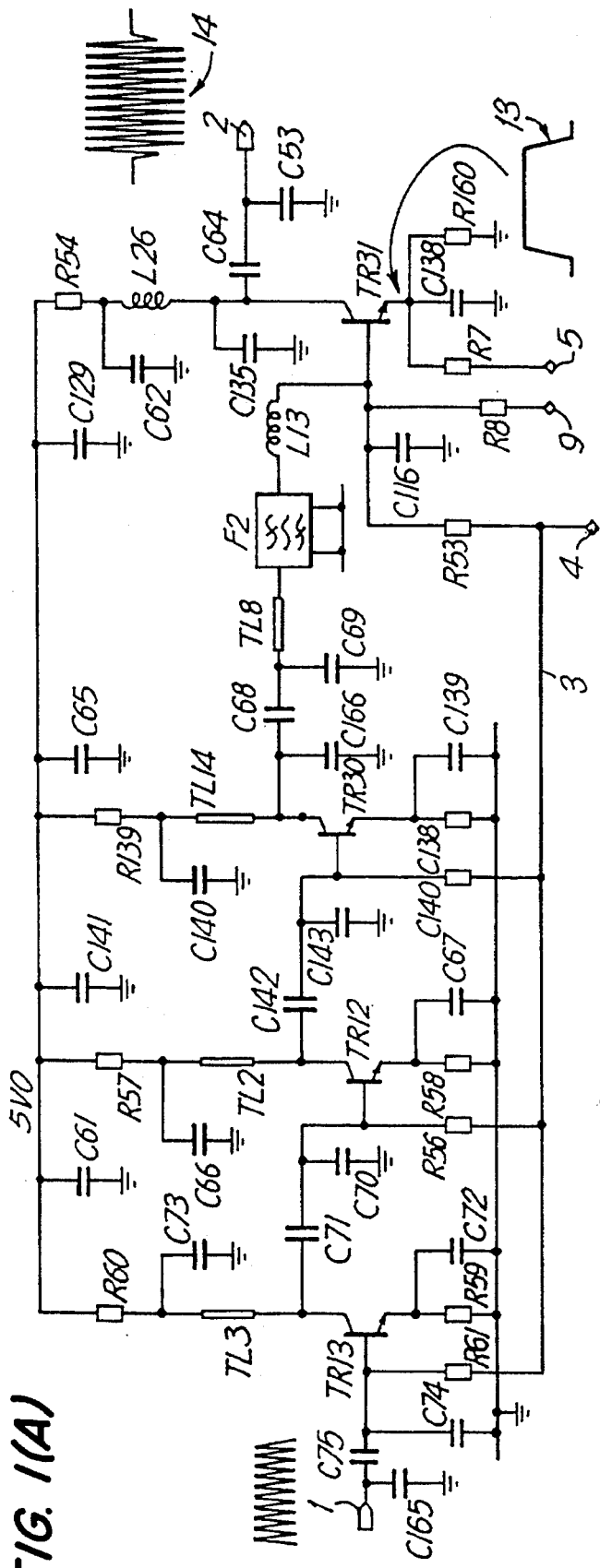
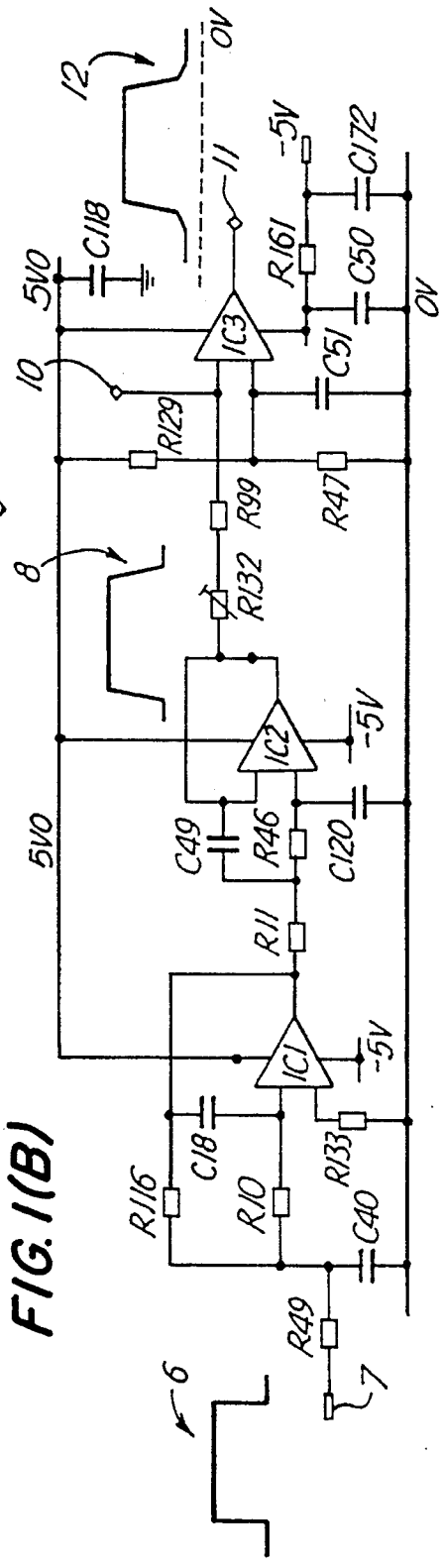
FIG. 1(A)
FIG. 1(B)

METHOD AND APPARATUS FOR CONTROLLING AMPLIFIER POWER

BACKGROUND OF THE INVENTION

This invention relates to a method and apparatus for controlling the output power of an amplifier and in particular to the control of the output power of an R.F. amplifier used in a transmitter.

The specific application envisaged is in the transmitter section of the transceiver used in cordless telephone units of the type in which communication between one or more base units and a plurality of portable handset units is achieved by a TDD (time division duplex) system in which transmission bursts, usually alternated with reception windows, are passed between the units.

SUMMARY OF THE INVENTION

The method employed in the present invention enables the rise and/or fall times of the transmit bursts to be controlled. The method also controls gain fluctuations in the transmitter R.F. amplifier chain to give a constant output level.

The method of the invention involves deriving a feedback signal representative of the flow of dc current through at least one of the transistors in the R.F. amplifier, comparing this feedback signal with a reference signal having a desired envelope shape to produce an error signal, and thence using said error signal to control the gain of the R.F. amplifier.

The method of the invention is realised by controlling the current through the signal amplifier so that the amplifier is in a state of saturation. This limits the output level that can be produced; in other words, the output power from the amplifier is limited by the current supplied to it and not by the gain of the amplifier. In the preferred embodiment, the current through at least one stage of the signal amplifier is constantly compared to a reference current so that the current through the amplifier may be maintained at a fixed value compared to the value of the reference current. Thence, if the value of this reference current varies, then the signal amplifier current and hence the output level of the amplifier will vary in sympathy. The maximum output level is limited by the need for there to be enough input signal to the amplifier to maintain the amplifier in a state of saturation.

BRIEF DESCRIPTION OF THE DRAWINGS

In order that the invention may be better understood, an embodiment thereof will now be described by way of example only and with reference to the accompanying drawings in which is a circuit diagram is shown in FIG. 1(A) illustrating a representative R.F. power amplifier being controlled and shown in FIG. 1(B) is an embodiment of a control circuit for controlling the output power of the amplifier.

DESCRIPTION OF THE PREFERRED EMBODIMENT

Referring to the drawings, FIG. A, is a circuit diagram of a representative R.F. amplifier comprising four cascaded common-emitter amplifier stages incorporating respective transistors TR13, TR12, TR30 and TR31. The stages are conventional broadband amplifiers and will not be described in detail. Between the third and fourth stages is a bandpass filter F2 which defines the frequency characteristic of the amplifier as a whole. The R.F. signal input is applied to terminal 1, and the R.F. signal output is taken from terminal 2.

Base bias is applied to each transistor from a common line 3 via respective resistors R61, R56, R140 and R53. The common line 3 connects to a terminal 4 which receives the output from the control circuit, to be described later.

The emitter of the final stage transistor TR31 is connected via a resistor R7 to a terminal 5 which outputs a signal proportional to the emitter voltage of transistor TR31. This emitter circuit is otherwise conventional, comprising an emitter resistor R160 and parallel bypass capacitor C138. The voltage at terminal 5 is thus representative of the voltage developed across emitter resistor R160 and hence of the value of the current flowing through the final stage. Likewise a signal representative of the base voltage of transistor TR31 is developed at a terminal 9. Terminal 9 is connected to the base via a high-value resistor R8.

The control circuit is shown in FIG. 1B and basically comprises a shaper circuit comprising integrated circuit differential amplifiers IC1 and IC2, and a comparator circuit comprising operational amplifier IC3. A generator (not shown) generates a rectangular reference voltage signal 6 which is applied to a reference input 7 to the shaper circuit. The shaper circuit low pass filters the reference signal 6 to produce a control signal 8 which is input to the comparator circuit. By means of the shaper circuit, the rise and fall times of the pulses comprising the control signal 8 may be controlled by a suitable choice of the resistor and capacitor component values associated with IC1 and IC2. The particular values of the rise and fall times will be dictated by the particular use to which the circuitry is to be put. The amplitude of the control signal 8 can be adjusted by means of a variable resistor R132.

The control signal 8 is applied to one input of the comparator comprising operational amplifier IC3 in which it is compared with a combined base and emitter feedback signal applied at a feedback input terminal 10. The feedback signal is derived by connecting together terminals 5 and 9, and connecting both to terminal 10. Because the value of resistor R7 is very much lower than that of resistor R8, the main component of the feedback signal applied to terminal 10 is that of TR31 emitter.

The output of the comparator circuit, at terminal 11, is applied to terminal 4, and hence to the common base bias line 3. An illustration of the output signal at terminal 11 is given under reference 12.

The dc conditions pertaining within the R.F. amplifier shown in FIG. A of the drawing are set such that all stages are in a saturated condition. This is achieved by limiting the dc current flow through the transistors comprising each of the stages, by suitable selection of component values. This is a well known technique, and will not be described further. The effect of the feedback control circuitry described above is such as to force the emitter voltage of transistor TR31, illustrated under reference 13, to follow the control signal 8. The output signal from the comparator circuit which is, in effect, the error signal of the control signal is applied, via line 3 and the respective resistors R61, R56, R140 and R53, to the base electrodes of the respective transistors TR13, TR12, TR30 and TR31 so that the base voltage is pulsed. At the low level (pulse off) the transistors are hard off and the input signal at terminal 1 is effectively cut off. As the pulse 12 rises, so the base voltages rise and the transistors start to amplify by an amount dictated by the amplitude of the pulse 12 which in turn is controlled by the setting of the variable resistor R132. Thus the power gain of each of the individual cascaded stages is under the control of variable resistor R132.

The result is that, from a continuous-wave (CW) input R.F. signal at terminal 1, we achieve an output signal 14 comprising pulsed bursts of amplified input signal, these pulsed bursts having rise and fall times corresponding to those of the control pulse 8. The amplitude of the R.F. bursts contained within the output signal (only one of which is shown under reference 14) is controlled by the variable resistor R132. Thus both the power gain, and the burst rise and fall times of the R.F. amplifier are both under the control of the parameters of the control circuit shown at B in the drawing.

Various modifications could be made to this circuitry. For example, although we have shown the base bias feedback signal applied to all stages, effective control may be achieved by applying the control to just some stages, particularly the latter stages. Also, although the feedback signal in the described embodiment is derived primarily from the emitter voltage of transistor TR31, in fact the signal could be derived wholly or primarily either from the collector or base electrodes, although less effectively from the base. The reason why, in the illustrated embodiment, a component of the base signal is applied, via terminal 9, as a feedback signal is to ensure linear conditions when the amplifier is in "quiescent" mode—i.e. when the pulse is off: in practice, when the control signal 8 is low, and the emitter of TR31 is at or near zero volts, a small amount of base feedback is desirable to keep the base bias on line 3 to about 0.3–0.5 V to ensure controlled transient and quiescent conditions.

It is to be emphasised that the R.F. amplifier illustrated is exemplary only; other amplifier circuitry could be used, and other amplifying devices, e.g. FET's could be employed.

I claim:

1. A method for controlling the output power of an amplifier comprising a number of cascaded transistor amplifier stages, said method comprising deriving a feedback signal directly proportional to the flow of dc current through one of the transistor amplifier stages, comparing this feedback signal with a control signal having a desired envelope shape to produce an error signal, and using said error signal to control the gain of at least some of the stages of the amplifier in such a way that the envelope shape of the amplifier output signal corresponds to that of the control signal.

2. A method as claimed in claim 1 wherein all the bias electrodes of the transistor stages to be controlled are connected via respective resistors to a common bias line, said method comprising applying said error signal to the common base line to thereby control the amplification of the controlled stages.

3. A method as claimed in claim 2 including controlling the current through the amplifier stages to be controlled so that they are in a state of saturation.

4. A method as claimed in any one of claims 1 to 3 wherein said feedback signal is derived from the final one of a plurality of controlled amplifier stages.

5. A method as claimed in claim 1 comprising deriving a further feedback signal representative of the potential of the input electrode of the transistor forming said one of the transistor amplifier stages, and combining said further feedback signal with the first-mentioned feedback signal to produce a composite feedback signal.

6. A method as claimed in claim 1 including generating a rectangular-waveform reference signal, and shaping said reference signal in a desired manner to produce said control signal.

7. Apparatus for controlling the output power of an amplifier comprising a number of cascaded transistor amplifier stages, said apparatus comprising means for generating a feedback signal directly proportional to the flow of dc current through one of the transistor amplifier stages, means for generating a control signal having a desired envelope shape, comparator means for comparing said feedback signal with said control signal to produce an error signal, and means for applying said error signal to the amplifier in such a way as to control the gain of at least some of the stages of the amplifier.

8. Apparatus as claimed in claim 7 wherein the input electrodes of all of the stages to be controlled are passed via respective resistors to a common bias line, and wherein said error signal is applied to said common line in order to control the gain as aforesaid.

9. Apparatus as claimed in claim 8 wherein the component values associated with each amplifier stage to be controlled are such as to maintain the respective stages in a state of saturation.

10. Apparatus as claimed in any one of claims 7 to 9 wherein said amplifier is a multi-stage amplifier, and wherein said one stage is the final stage of the amplifier.

11. Apparatus as claimed in claims 7 wherein said means for generating a control signal comprises means for generating a rectangular reference signal, and shaper means for shaping said reference signal in a desired manner to produce said control signal.

12. A method for controlling the output power of an amplifier comprising a number of cascaded transistor amplifier stages, said method comprising deriving a feedback signal representative of the flow of dc current through one of the transistor amplifier stages, comparing this feedback signal with a control signal having a desired envelope shape to produce an error signal, and using said error signal to control the gain of at least some of the stages of the amplifier in such a way that the envelope shape of the amplifier output signal corresponds to that of the control signal; wherein all the bias electrodes of the transistor stages to be controlled are connected via respective resistors to a common bias line, said method comprising applying said error signal to the common base line to thereby control the amplification of the controlled stages.

13. A method as claimed in claim 12 including controlling the current through the amplifier stages to be controlled so that they are in a state of saturation.

14. A method as claimed in claims 12 or 13, wherein said feedback signal is derived from the final one of a plurality of controlled amplifier stages.

15. A method for controlling the output power of an amplifier comprising a number of cascaded transistor amplifier stages, said method comprising deriving a feedback signal representative of the flow of dc current through one of the transistor amplifier stages, comparing this feedback signal with a control signal having a desired envelope shape to produce an error signal, and using said error signal to control the gain of at least some of the stages of the amplifier in such a way that the envelope shape of the amplifier output signal corresponds to that of the control signal; comprising deriving a further feedback signal representative of the potential of the input electrode of the transistor forming said one of the transistor amplifier stages, and combining said further feedback signal with the first-mentioned feedback signal to produce a composite feedback signal.

16. Apparatus for controlling the output power of an amplifier comprising a number of cascaded transistor amplifier stages, said apparatus comprising means for generating a feedback signal representative of the flow of dc current through one of the transistor amplifier stages, means for generating a control signal having a desired envelope shape, comparator means for comparing said feedback signal with said control signal to produce an error signal, and means for applying said error signal to the amplifier in such a way as to control the gain of at least some of the stages of the amplifier; wherein the input electrodes of all of the stages to be controlled are passed via respective resistors to a common bias line, and wherein said error signal is applied to said common line in order to control the gain as aforesaid.

17. Apparatus as claimed in claim 16 wherein the component values associated with each amplifier stage to be controlled are such as to maintain the respective stages in a state of saturation.

18. Apparatus as claimed in claims 16 or 17, wherein said amplifier is a multi-stage amplifier, and wherein said one stage is the final stage of the amplifier.

\* \* \* \* \*